US012747649B2

(12) United States Patent
Gunasekaran et al.

(10) Patent No.: US 12,747,649 B2
(45) Date of Patent: Sep. 29, 2026

(54) SAFETY VALVE, WELL SYSTEM, AND METHOD EMPLOYING AN ELECTRICAL SENSOR

(71) Applicant: Halliburton Energy Services, Inc., Houston, TX (US)

(72) Inventors: Mohan Gunasekaran, Al Khobar (SA); Ibrahim El Mallawany, Al Khobar (SA); David Allen Dockweiler, Singapore (SG); Matthew L. Apiecionek, Carrollton, TX (US); Michael Linley Fripp, Singapore (SG); Aswin Balasubramanian, Spring, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 177 days.

(21) Appl. No.: 18/907,843

(22) Filed: Oct. 7, 2024

(65) Prior Publication Data

US 2026/0098457 A1 Apr. 9, 2026

(51) Int. Cl.
*E21B 34/06* (2006.01)
*G01M 13/003* (2019.01)
*G01R 17/02* (2006.01)

(52) U.S. Cl.
CPC ......... *E21B 34/066* (2013.01); *G01M 13/003* (2019.01); *G01R 17/02* (2013.01)

(58) Field of Classification Search
CPC ..... E21B 34/066; G01R 17/02; G01M 13/003
See application file for complete search history.

(56) References Cited

U.S. PATENT DOCUMENTS

| | | | |
|---|---|---|---|
| 2,788,662 A | 4/1957 | Wiley | |
| 11,732,551 B1 | 8/2023 | Tang et al. | |
| 2003/0121665 A1 | 7/2003 | Trott et al. | |
| 2007/0291438 A1 | 12/2007 | Ahrens et al. | |
| 2013/0054034 A1 | 2/2013 | Ebenezer | |
| 2014/0262234 A1 | 9/2014 | Walton et al. | |
| 2015/0356521 A1 | 12/2015 | Sridhar et al. | |
| 2016/0194933 A1 | 7/2016 | O'Brien et al. | |
| 2016/0265309 A1* | 9/2016 | Vick, Jr. | F16K 31/1221 |
| 2020/0182045 A1 | 6/2020 | Hill et al. | |

(Continued)

FOREIGN PATENT DOCUMENTS

CN 111425164 7/2020

*Primary Examiner* — Minh Q Phan

(74) *Attorney, Agent, or Firm* — Scott Richardson; Parker Justiss, P.C.

(57) ABSTRACT

A safety valve, a well system and a method is disclosed. The safety valve, in one aspect, includes a tubular housing, a flow tube positioned within the tubular housing, a valve closure mechanism positioned within the tubular housing, the flow tube configured to move between a closed position and an open position and thereby move the valve closure mechanism between a closed state and an open state, an electromagnet coupled to one of the tubular housing or the flow tube, and one or more permanent magnets coupled to an other of the flow tube or the tubular housing. The safety valve according to this one aspect, may further include an electrical sensor coupled to the electromagnet, the electrical sensor configured to sense for a change in an electrical parameter associated with the electromagnet to determine a health of the safety valve.

25 Claims, 10 Drawing Sheets

(56) References Cited

U.S. PATENT DOCUMENTS

| | | | |
|---|---|---|---|
| 2020/0370988 | A1 | 11/2020 | Rogers et al. |
| 2021/0396095 | A1 | 12/2021 | Roth |
| 2023/0261588 | A1 | 8/2023 | Agamy et al. |
| 2024/0018846 | A1 | 1/2024 | Geiger et al. |

* cited by examiner

SAFETY VALVE, WELL SYSTEM, AND METHOD EMPLOYING AN ELECTRICAL SENSOR

BACKGROUND

Downhole devices, such as subsurface safety valves (SSSVs) are well known in the oil and gas industry, and provide one of many failsafe mechanisms to prevent the uncontrolled release of subsurface production fluids, should a wellbore system experience a loss in containment. In certain instances, SSSVs comprise a portion of a tubing string, the entirety of the SSSVs being set in place during completion of a wellbore. In other instances, the SSSVs are wireline deployed/retrieved. Although a number of design variations are possible for SSSVs, the vast majority are flapper-type valves that open and close in response to axial movement of a flow tube.

Since SSSVs typically provide a failsafe mechanism, the default positioning of the flapper valve is usually closed in order to minimize the potential for inadvertent release of subsurface production fluids. The flapper valve can be opened through various means of control from the earth's surface in order to provide a flow pathway for production to occur. What is needed in the art is an improved SSSV that does not encounter the problems of existing SSSVs.

BRIEF DESCRIPTION

Reference is now made to the following descriptions taken in conjunction with the accompanying drawings, in which:

FIG. 1 illustrates a well system designed, manufactured and/or operated according to one or more embodiments of the disclosure;

FIGS. 2A and 2B illustrate one embodiment of a safety valve designed and manufactured according to one or more embodiments of the present disclosure, in a closed state and an open state, respectively; and FIGS. 3A and 3B illustrate one embodiment of a safety valve designed, manufactured and/or operated according to one or more alternative embodiments of the present disclosure, closed and open, respectively;

DETAILED DESCRIPTION

Figure 1:
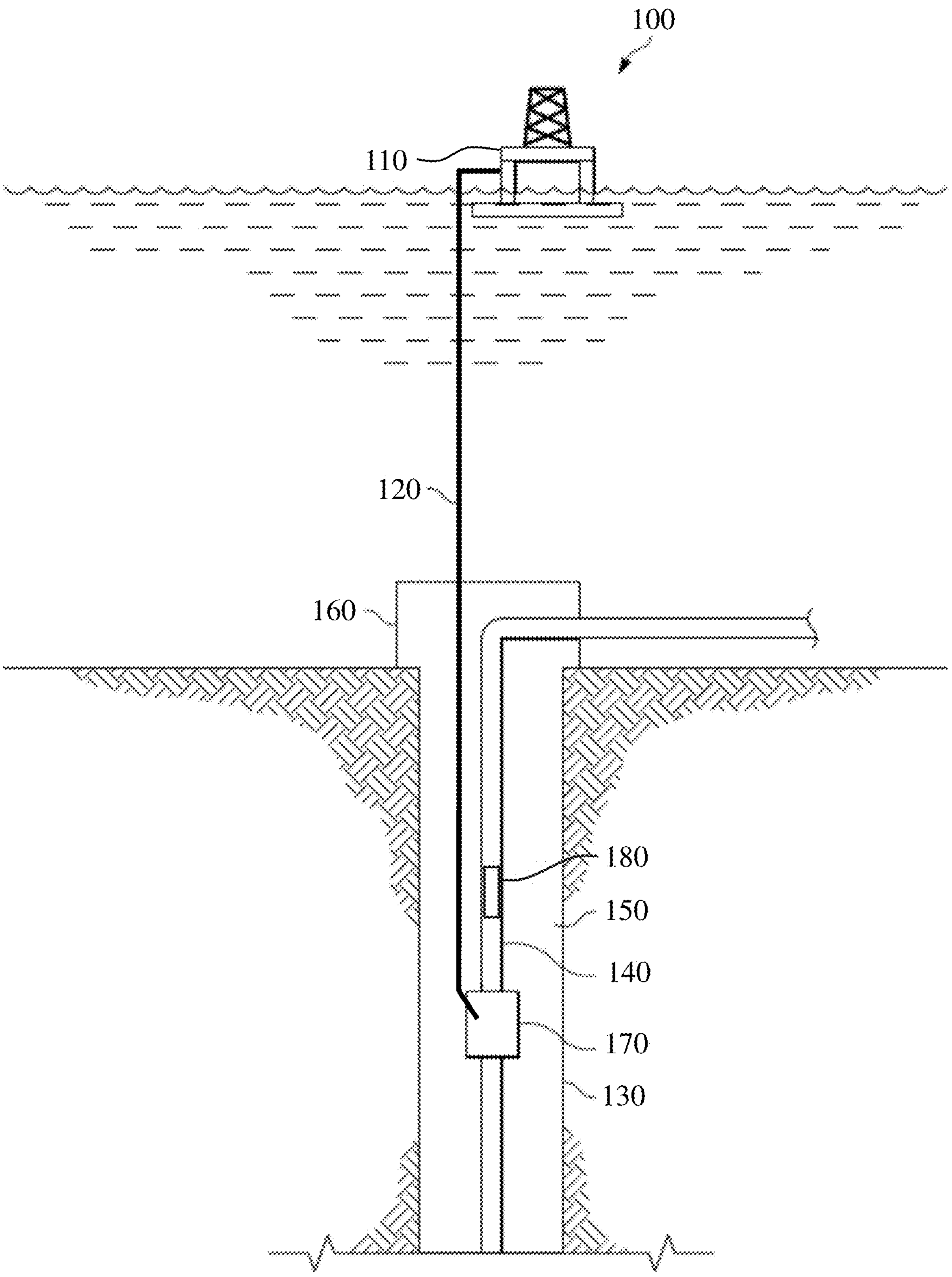

In the drawings and descriptions that follow, like parts are typically marked throughout the specification and drawings with the same reference numerals, respectively. The drawn figures are not necessarily, but may be, to scale. Certain features of the disclosure may be shown exaggerated in scale or in somewhat schematic form and some details of certain elements may not be shown in the interest of clarity and conciseness. The present disclosure may be implemented in embodiments of different forms. Specific embodiments are described in detail and are shown in the drawings, with the understanding that the present disclosure is to be considered an exemplification of the principles of the disclosure, and is not intended to limit the disclosure to that illustrated and described herein. It is to be fully recognized that the different teachings of the embodiments discussed herein may be employed separately or in any suitable combination to produce desired results. Moreover, all statements herein reciting principles and aspects of the disclosure, as well as specific examples thereof, are intended to encompass equivalents thereof. Additionally, the term, "or," as used herein, refers to a non-exclusive or, unless otherwise indicated.

Unless otherwise specified, use of the terms "connect," "engage," "couple," "attach," or any other like term describing an interaction between elements is not meant to limit the interaction to direct interaction between the elements and may also include indirect interaction between the elements described.

Unless otherwise specified, use of the terms "up," "upper," "upward," "uphole," "upstream," or other like terms shall be construed as generally away from the bottom, terminal end of a well, regardless of the wellbore orientation; likewise, use of the terms "down," "lower," "downward," "downhole," or other like terms shall be construed as generally toward the bottom, terminal end of a well, regardless of the wellbore orientation. Use of any one or more of the foregoing terms shall not be construed as denoting positions along a perfectly vertical or horizontal axis. Unless otherwise specified, use of the term "subterranean formation" shall be construed as encompassing both areas below exposed earth and areas below earth covered by water, such as ocean or fresh water.

Various values and/or ranges may be explicitly disclosed in certain embodiments herein. However, values/ranges from any lower limit may be combined with any upper limit to recite a range not explicitly recited. Similarly, values/ranges from any lower limit may be combined with any other lower limit to recite a range not explicitly recited. In the same way, values/ranges from any upper limit may be combined with any other upper limit to recite a range not explicitly recited. Additionally, whenever a numerical range with a lower limit and an upper limit is disclosed, any number and any included range falling within the range are specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values even if not explicitly recited. Thus, every point or individual value may serve as its own lower or upper limit combined with any other point or individual value or any other lower or upper limit, to recite a range not explicitly recited. Similarly, an individual value disclosed herein may be combined with another individual value or range disclosed herein to form another range.

The present disclosure has developed a safety valve that allows the user to predict the health of the safety valve in downhole applications. In at least one embodiment, the present disclosure uses one or more temperature sensors thermally coupled to an electromagnet of the safety valve. In at least this one embodiment, the one or more temperature sensors are configured to sense for a change in a temperature of the electromagnet to determine a health of the safety valve. For example, a sensed increase in temperature of the electromagnet could indicate to the operator that the electromagnet is having difficulties and/or about to fail, at which time the operator could undertake one or more predetermined measures.

In at least one other embodiment, the present disclosure uses one or more pressure sensors coupled to a flow tube of the safety valve. In at least this one embodiment, the one or more pressure sensors are configured to sense for a change in pressure associated with the flow tube to determine a health of the safety valve. For example, a sensed increase in pressure on a back side of a piston associated with the flow tube could indicate to the operator that there is debris settlement arresting movement of the flow tube, at which time the operator could undertake one or more predetermined measures.

In at least one other embodiment, the present disclosure uses one or more electrical sensors coupled to an electromagnet of the safety valve. In at least this one embodiment, the one or more electrical sensors are configured to sense for a change in an electrical parameter associated with the electromagnet to determine a health of the safety valve. For example, a sensed increase in a parameter (e.g., increase in current and/or inductance required to maintain the flow tube in the open position) could indicate to the operator that problems exist with the electromagnet, at which time the operator could undertake one or more predetermined measures.

Most any abnormality measured with the aforementioned temperature, pressure and/or electrical parameter sensors can be identified by looking at the data points obtained thereby (e.g., over time). For example, the data points taken over time could be used to sense the health of the safety valve, and if it appears that the safety valve is encountering problems, develop a plan for fixing the safety valve. In fact, such information may be used to sense issues of the safety valve that may be corrected prior to the safety valve actually failing. Moreover, such an idea may be used on all types of safety valves, tubing retrievable safety valves (TRSVs) and wireline retrievable safety valves (WLRSVs) included. Moreover, certain embodiments may simultaneously employ two or more of the temperature, pressure and/or electrical parameter sensors, which would provide additional benefits over simply using a single one of the same.

FIG. 1 illustrates a well system 100 designed, manufactured and/or operated according to one or more embodiments of the disclosure. The well system 100, in at least one embodiment, includes an offshore platform 110 connected to a first downhole device 170 (e.g., first SSSV, such as a TRSV) and a second downhole device 180 (e.g., second SSSV, such as a WLRSV) via a primary control line 120 (e.g., single electrical control line, TEC, etc.). An annulus 150 may be defined between walls of a wellbore 130 and a conduit 140. A wellhead 160 may provide a means to hand off and seal the conduit 140 against the wellbore 130 and provide a profile to latch a subsea blowout preventer to. The conduit 140 may be coupled to the wellhead 160. The conduit 140 may be any conduit such as a casing, liner, production tubing, or other oilfield tubulars disposed in a wellbore.

The first downhole device 170, or at least a portion thereof, may be interconnected with the conduit 140 (e.g., interconnected in line with the conduit 140) and positioned in the wellbore 130. The second downhole device 180, or at least a portion thereof, may be interconnected with the conduit 140 (e.g., positioned within an inside diameter (ID) or outside diameter (OD) of the conduit 140) and positioned in the wellbore 130. In the illustrated embodiment, the second downhole device 180 is illustrated uphole of the first downhole device 170 (e.g., a portion of it being run-in-hole with the first downhole device 170 and another portion of it being run-in-hole after the first downhole device 170 has failed), but other embodiments may exist wherein the second downhole device 180 is located downhole of the first downhole device 170.

The primary control line 120 may extend into the wellbore 130 and may be connected to the first downhole device 170 and the second downhole device 180. The primary control line 120 may provide power and/or fluid pressure and/or communications to the first downhole device 170 and the second downhole device 180. As will be described in further detail below, fluid pressure (e.g., provided from below or above the first downhole device 170 and the second downhole device 180) may be used to actuate or de-actuate the first downhole device 170 or the second downhole device 180. Actuation may comprise holding the first downhole device 170 or the second downhole device 180 in an open position, thereby providing a flow path for subsurface production fluids to enter the conduit 140, and de-actuation may comprise allowing the first downhole device 170 or the second downhole device 180 to move toward a closed position, thereby closing a flow path for subsurface production fluids to enter the conduit 140. While the embodiment of FIG. 1 illustrates only the first downhole device 170 and the second downhole device 180, other embodiments exist wherein more than two downhole devices according to the disclosure are used.

Although the well system 100 is depicted in FIG. 1 as an offshore well system, one of ordinary skill should be able to adopt the teachings herein to any type of well, including onshore or offshore. In the embodiment of FIG. 1, the first downhole device 170 is a TRSV, and the second downhole device 180 is a WLRSV, and the temperature, pressure and/or electrical parameter sensors disclosed herein may be used in one or more of the first downhole device 170 and the second downhole device 180.

Figure 2A:
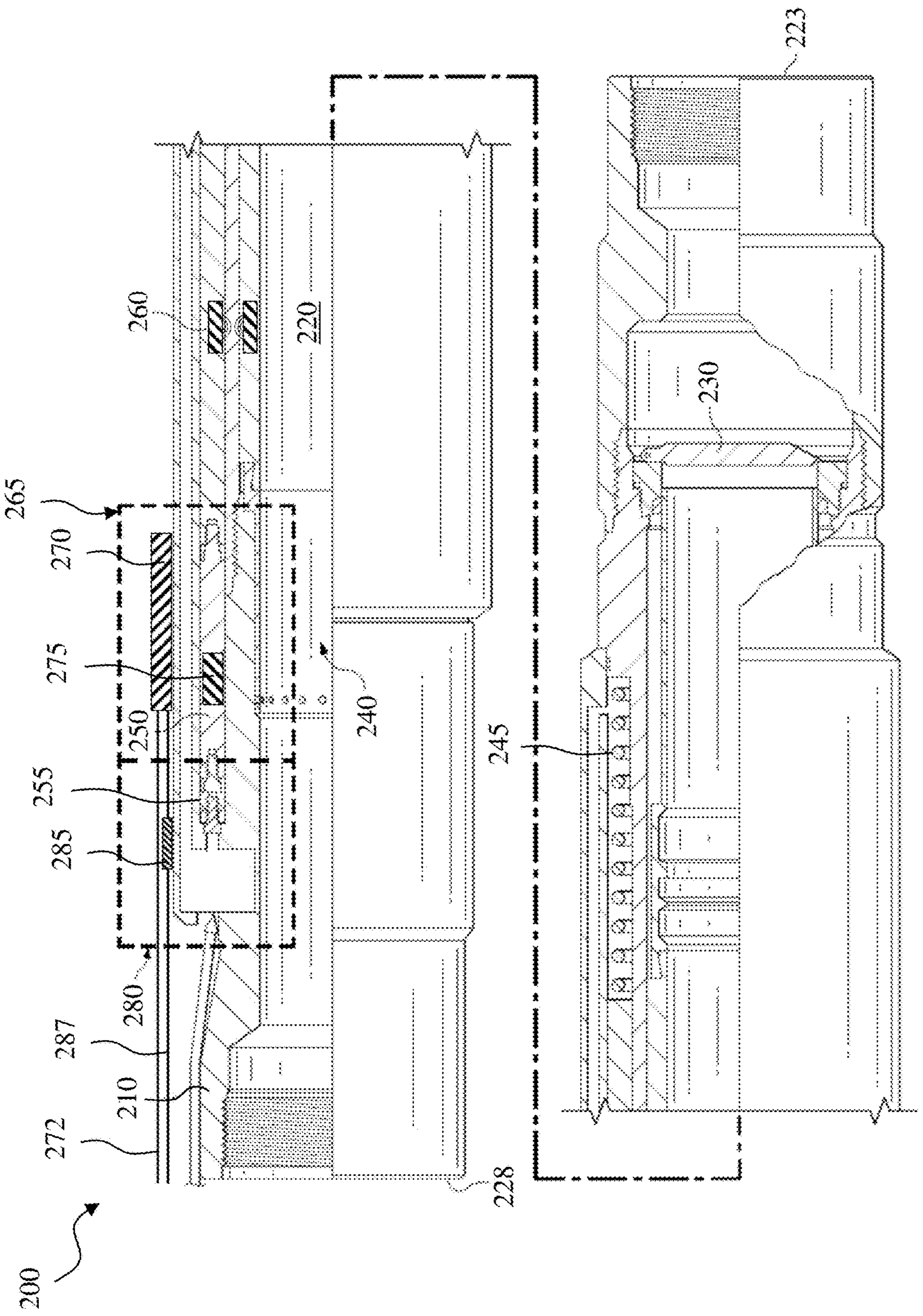
Figure 2B:
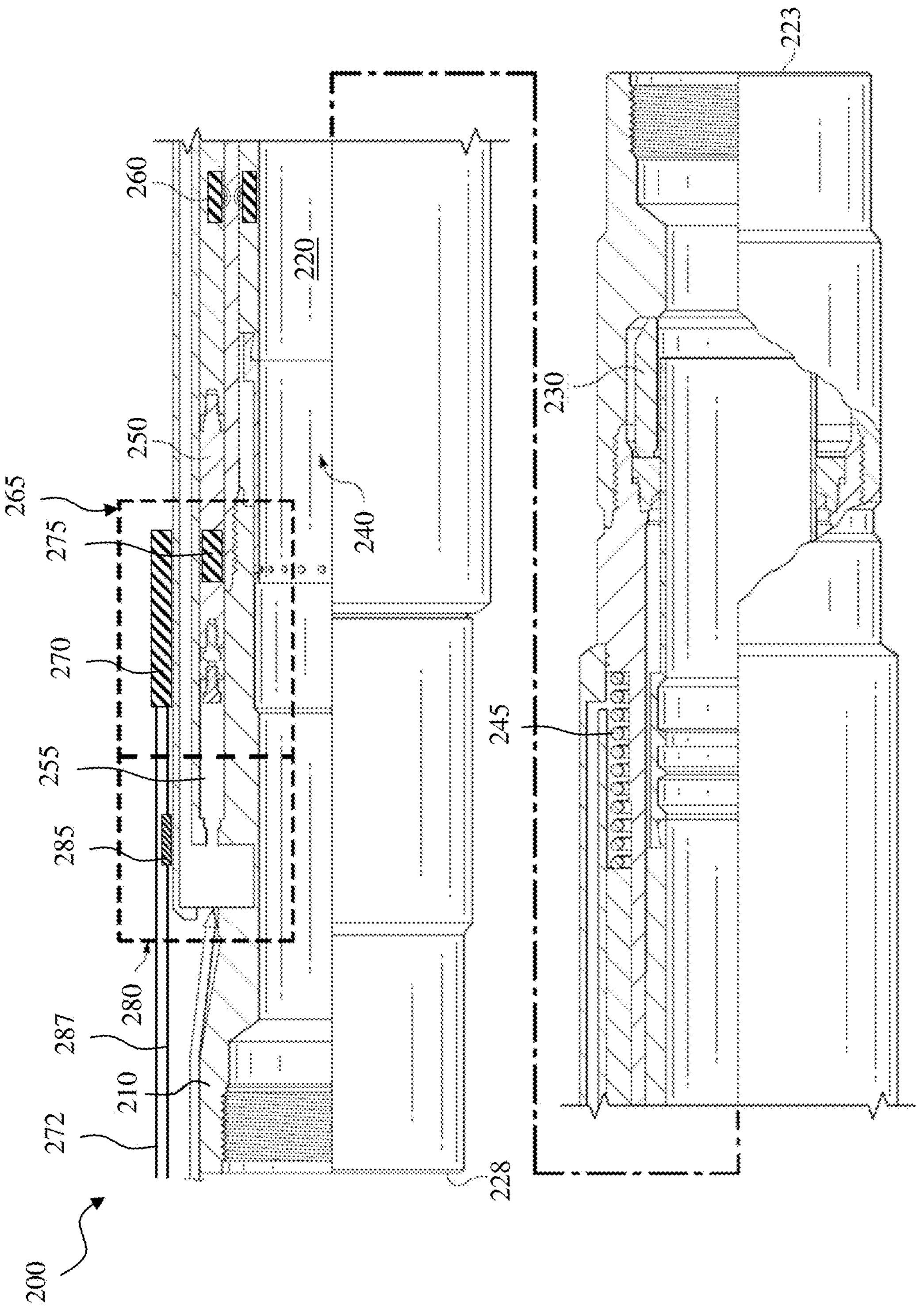

Turning now to FIGS. 2A and 2B, illustrated is one embodiment of a safety valve 200 designed, manufactured and/or operated according to one or more embodiments of the present disclosure, closed and open, respectively. The safety valve 200, in the embodiment of FIGS. 2A and 2B, includes a tubular housing 210. The tubular housing 210, in the illustrated embodiment, includes a central bore 220 extending there through, the central bore 220 operable to convey subsurface production fluids from a subterranean formation. The central bore 220, in the illustrated embodiment, includes a lower section 223 and an upper section 228.

The safety valve 200, in one or more embodiments, additionally includes a valve closure mechanism 230 disposed proximate the lower section 223 of the central bore 220. The valve closure mechanism 230 may isolate the lower section 223 of the central bore 220 from the upper section 228, which may prevent formation fluids and pressure from flowing through the safety valve 200 when the valve closure mechanism 230 is in a closed state. The valve closure mechanism 230 may be any type of valve, such as a flapper type valve or a ball type valve, among others. FIG. 2A illustrates the valve closure mechanism 230 as being a flapper type valve in the closed state, whereas FIG. 2B illustrates the valve closure mechanism 230 as being a flapper type valve in the open state. The valve closure mechanism 230, in at least one embodiment, includes a closure mechanism (e.g., a return spring) configured to return the valve closure mechanism 230 from the open state shown in FIG. 2B to the closed state shown in FIG. 2A.

The safety valve 200, in one or more embodiments, additionally includes a flow tube 240 (e.g., bore flow management actuator) disposed in the central bore 220. The flow tube 240, in the illustrated embodiment, is configured to move between a closed position (e.g., retracted state as shown in FIG. 2A) and an open position (e.g., deployed state as shown in FIG. 2B) to engage or disengage the valve closure mechanism 230. Accordingly, the flow tube 240 may determine a flow condition of subsurface production fluids through the central bore 220, simply by moving between the closed position and the open position. The safety valve 200 may additionally include a power spring 245, the power spring 245 configured to return the flow tube 240 to the retracted state when needed. While not shown, certain other embodiments may employ a nose spring, in addition to the power spring 245.

The safety valve 200, in one or more embodiments, additionally includes an actuation member 250 located in an actuation member chamber 255. In the illustrated embodiment, the actuation member 250 is a hydraulically controlled actuation member, and thus is actuated using fluid pressure. In at least one embodiment, the fluid pressure may be pressure supplied from an uphole side of the safety valve 200, or alternatively a downhole side of the safety valve 200. The actuation member 250, which is illustrated in FIGS. 2A and 2B as a piston, is movably coupled with the flow tube 240. Accordingly, if/when the actuation member 250 linearly moves (e.g., based upon fluid pressure thereon), the flow tube 240 (e.g., being coupled thereto) also linearly moves.

In at least one embodiment, the actuation member 250 is physically coupled to the flow tube 240. In yet another embodiment, such as that shown, the actuation member 250 is magnetically coupled to the flow tube 240 (e.g., using a series of permanent magnets 260). Notwithstanding the method for coupling the actuation member 250 and the flow tube 240, in at least one embodiment, when the actuation member 250 linearly moves a distance X, the flow tube 240 moves in lock step with the actuation member 250, and thus also moves the distance X. Ultimately, movement of the actuation member 250 moves the flow tube 240 between the closed position and the open position (e.g., the flow tube 240 engaging the valve closure mechanism 230 to allow it to move between the closed state and the open state).

In at least this one embodiment, the safety valve 200 includes a failsafe mechanism 265, the failsafe mechanism 265 including an electromagnet 270 coupled to one of the tubular housing 210 or the flow tube 240 (e.g., actuation member 250), and one or more failsafe permanent magnets 275 coupled to an other of the flow tube 240 (e.g., actuation member 250) or the tubular housing 210. For example, in the illustrated embodiment, the electromagnet 270 is coupled to the tubular housing 210 and the one or more failsafe permanent magnets 275 are coupled to the flow tube 240 (e.g., through the actuation member 250 and associated series of permanent magnets 260).

In operation, once the flow tube 240 is located in the open position, and thus is propping the valve closure mechanism 230 in the open state, the electromagnet 270 may be energized, thereby fixing the flow tube 240 in this open position and valve closure mechanism 230 in this open state. Similarly, once the electromagnet 270 is energized, pressure on the actuation member 250 may be reduced and/or eliminated as desired, the energized electromagnet 270 keeping the flow tube 240 in this open position and valve closure mechanism 230 in this open state. Accordingly, the flow tube 240 will remain in the open position so long as the electromagnet 270 is energized. Nevertheless, if power is lost or cut to the electromagnet 270 (e.g., and thus it is no longer magnetically coupled with the one or more failsafe permanent magnets 275), the failsafe mechanism will kick in, and the power spring 245 will return the flow tube 240 to the closed position, thereby allowing the valve closure mechanism 230 to return to its closed state.

The safety valve 200 illustrated in FIGS. 2A and 2B additionally includes a health/safety component system 280, the health/safety component system 280 configured to help in determining and/or measuring the health of the safety valve 200. In the embodiment of FIGS. 2A and 2B, the health/safety component system 280 includes a temperature sensor 285 thermally coupled to the electromagnet 270. In at least this one embodiment, the temperature sensor 285 is configured to sense for a change in a temperature of the electromagnet 270 to determine a health of the safety valve. For example, in at least one embodiment, the electromagnet 270 includes one or more coils, and the temperature sensor 285 is thermally coupled to the one or more coils, and thus is configured to sense for a change in a temperature of the one or more coils to determine the health of the safety valve.

A variety of different measurements may be obtained using the temperature sensor 285 (e.g., relating to the change in temperature of the electromagnet 270) and remain within the scope of the disclosure. For example, the temperature sensor 285 may sense for increases in temperature, or alternatively sense for decreases in temperature. In the illustrated embodiment, however, the temperature sensor 285 is configured to sense for an increase in the temperature of the electromagnet 270 to determine the health of the safety valve. For example, in at least one embodiment, the temperature sensor 285 is configured to sense for at least a 2 percent change (e.g., 2 percent increase) in the temperature of the electromagnet 270. In yet another embodiment, the temperature sensor 285 is configured to sense for at least a 10 percent change (e.g., 10 percent increase in the temperature) of the electromagnet 270. In even yet another embodiment, the temperature sensor 285 is configured to sense for at least a 25 percent change (e.g., 25 percent increase in the temperature) of the electromagnet 270, if not other values. By a percent change, we mean the percentage difference between the actual temperature difference between the electromagnet 270 being energized and the electromagnet 270 not being energized versus the expected temperature difference. For example, in the non-energized state, the electromagnet 270 may be at a temperature close to the formation temperature, such as 100° C. When the electromagnet 270 is energized, the current flowing through the coils will produce ohmic heating and the temperature will rise. In normal operation, we expect that the temperature will rise to 110° C. If we instead measure a temperature rise of 113° C., then this would represent a 30 percent increase in the temperature of the electromagnet 270 (113° C.-100° C.)/(110° C.-100° C.)=0.3=30%. In yet another embodiment, the temperature sensor 285 is configured to measure the temperature of the electromagnet 270 above a threshold value (e.g., formation temperature). The same percentages disclosed above could apply to such an embodiment. In even yet another embodiment, the temperature sensor 285 is configured to measure a time rate of change of the temperature of the electromagnet 270. For example, the temperature will rise as the ohmic heating occurs, and the slope of the rise indicates rate that heat is being generated within the electromagnet 270. Thus, the temperature sensor 285 may monitor the time rate of change of the temperature (degrees per second) and a higher time rate of change indicates more ohmic heating, and thus potentially an unhealthy electromagnet 270.

In even yet other embodiments, the temperature sensor 285 is configured to take systematic and periodic temperature measurements of the electromagnet 270, for example regardless of a sensed temperature change. For example, the temperature sensor 285 could be configured to take systematic and periodic temperature measurements of the electromagnet 270 every Y minutes, wherein Y ranges from 0.1 seconds to 30 days, if not from 1 second to 1 day, if not from 1 minute to 1 hour, among others. In at least one embodiment, Y is 1 minute, or 5 minutes, or 15 minutes, or 30 minutes, or 60 minutes, for 12 hours, or 24 hours, or 15 days, or 30 days, etc.

The placement of the temperature sensor 285 may vary, for example depending on the design of the safety valve 200. For example, in the illustrated embodiment of FIGS. 2A and 2B, the temperature sensor 285 is physically coupled to the tubular housing 210. In at least one embodiment, the temperature sensor 285 is physically coupled to the tubular housing 210 within 1 meter of the electromagnet 270. In yet another embodiment, the temperature sensor 285 is physically coupled to the tubular housing 210 within 0.2 meters of the electromagnet 270, if not within 0.1 meters, 0.05 meters, or 0.01 meters, among others, of the electromagnet 270.

The embodiment of FIGS. 2A and 2B have illustrated a first power line 272 coupled to the electromagnet 270 and a second different communications line 287 coupled to the temperature sensor 285. Presumably, one or more of the first power line 272 or the second different communications line 287 extend entirely uphole to the opening of the wellbore. Nevertheless, in certain embodiments, the second different communications line 287 may not extend entirely uphole, but may use another form of wireless communication to transfer any information obtained by the temperature sensor 285 uphole. In yet another embodiment (e.g., not shown), a single power/communications line is employed to power the electromagnet 270 and transfer communications to/from the temperature sensor 285. In this embodiment, a power and/or communication interface (e.g., not shown) may exist between the temperature sensor 285 and the single power/communications line.

Regardless of how the information is transferred uphole, the information may be in the form of raw data or processed data. If the information being sent uphole is processed data, the temperature sensor 285 would additionally include one or more processors and/or memory, which could be used to process the raw data before sending it uphole. If the information being sent uphole is raw data, this raw data can be processed uphole using similar processors and/or memory.

Figure 3A:
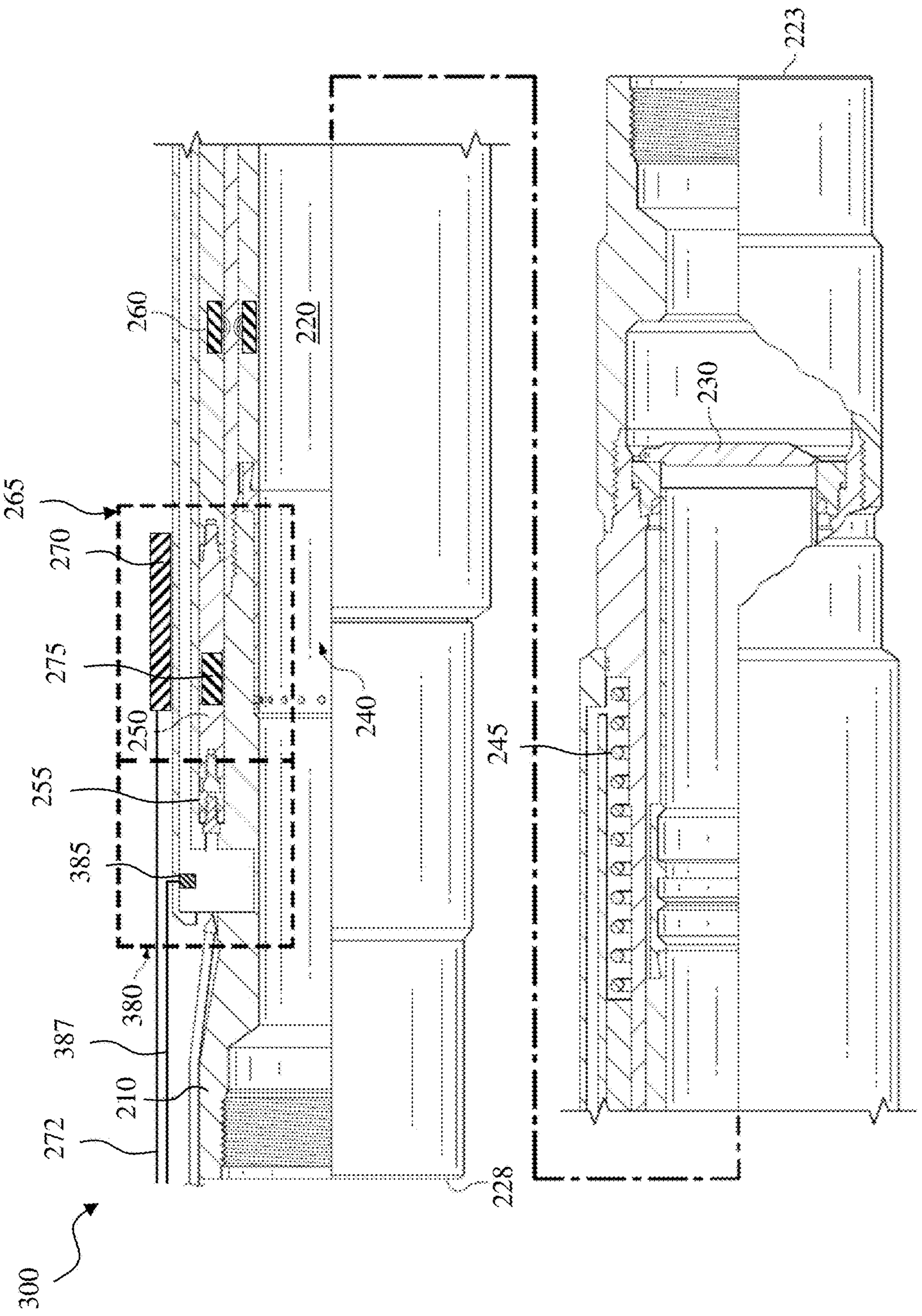
Figure 3B:
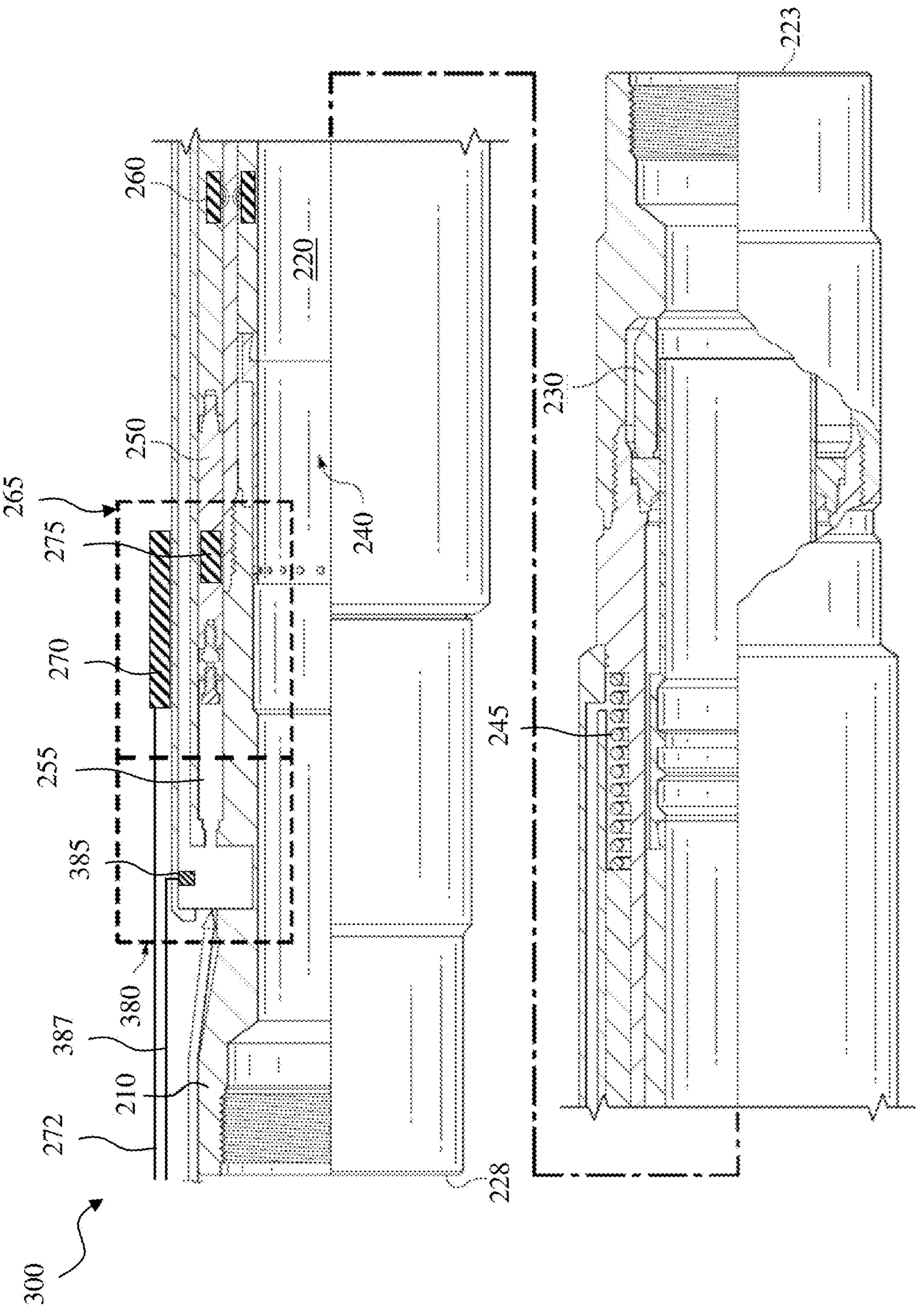

Turning now to FIGS. 3A and 3B, illustrated is one embodiment of a safety valve 300 designed, manufactured and/or operated according to one or more alternative embodiments of the present disclosure, closed and open, respectively. The safety valve 300 of FIGS. 3A and 3B is similar in many respects to the safety valve 200 of FIGS. 2A and 2B. Accordingly, like reference numbers have been used to indicate similar, if not identical, features. The safety valve 300 differs, for the most part, from the safety valve 200, in that the safety valve 300 employs a health/safety component system 380 including a pressure sensor 385. In the illustrated embodiment, the pressure sensor 385 is coupled to the flow tube 240 (e.g., through the actuation member 250 and series of permanent magnets 260). The pressure sensor 385, in the illustrated embodiment, is configured to sense for a change in pressure associated with the flow tube 240 to determine a health of the safety valve 300.

In the illustrated embodiment of FIGS. 3A and 3B, the actuation member 250 is a hydraulically controlled actuation member located in an actuation member chamber 255. In accordance with this one embodiment, the hydraulically controlled actuation member is a piston and the actuation member chamber is a piston chamber. The pressure sensor 385 may be positioned in many different locations and remain within the scope of the disclosure, for example coupled to the terranean surface using a pressure sensor conductor 387. In at least one embodiment, the pressure sensor 385 is coupled to the piston chamber. For example, in at least one embodiment, the pressure sensor 385 is coupled to the piston chamber on a side of the piston distal the valve closure mechanism 230. Thus, in at least one embodiment, the pressure sensor 385 is configured to measure for changes in back pressure on the piston over time, and thus be used to indicate that there is debris settlement arresting movement of the flow tube 240. For example, in at least one embodiment, the pressure sensor 385 is configured to measure for at least a 2 percent increase in pressure on the piston over time. In at least one other embodiment, the pressure sensor 385 is configured to measure for at least a 10 percent increase in pressure on the piston over time. In yet at least one other embodiment, the pressure sensor 385 is configured to measure for at least a 25 percent increase in pressure on the piston over time. In yet another embodiment, the pressure sensor 385 is configured to measure for exceeding a threshold value or failing to meet a threshold value. In even yet another embodiment, the pressure sensor 385 is configured to measure a time rate of change of the pressure. As pressure is applied at the surface and there will be a time delay until the pressure is measured downhole due to fluid friction. Measuring the pressure rise indicates the health of the control line. As the flow tube moves, the pressure will drop (or not rise as much) because there is space for the fluid. Measuring the time evolution of the pressure indicates the health of the valve. For example, the operator may note the pressure at which motion commences by noting a change in the slope of the pressure change with respect to time. The operator may also note friction or scale in the valve movement by detecting that a higher pressure is needed to maintain the movement of the valve.

Figure 4A:
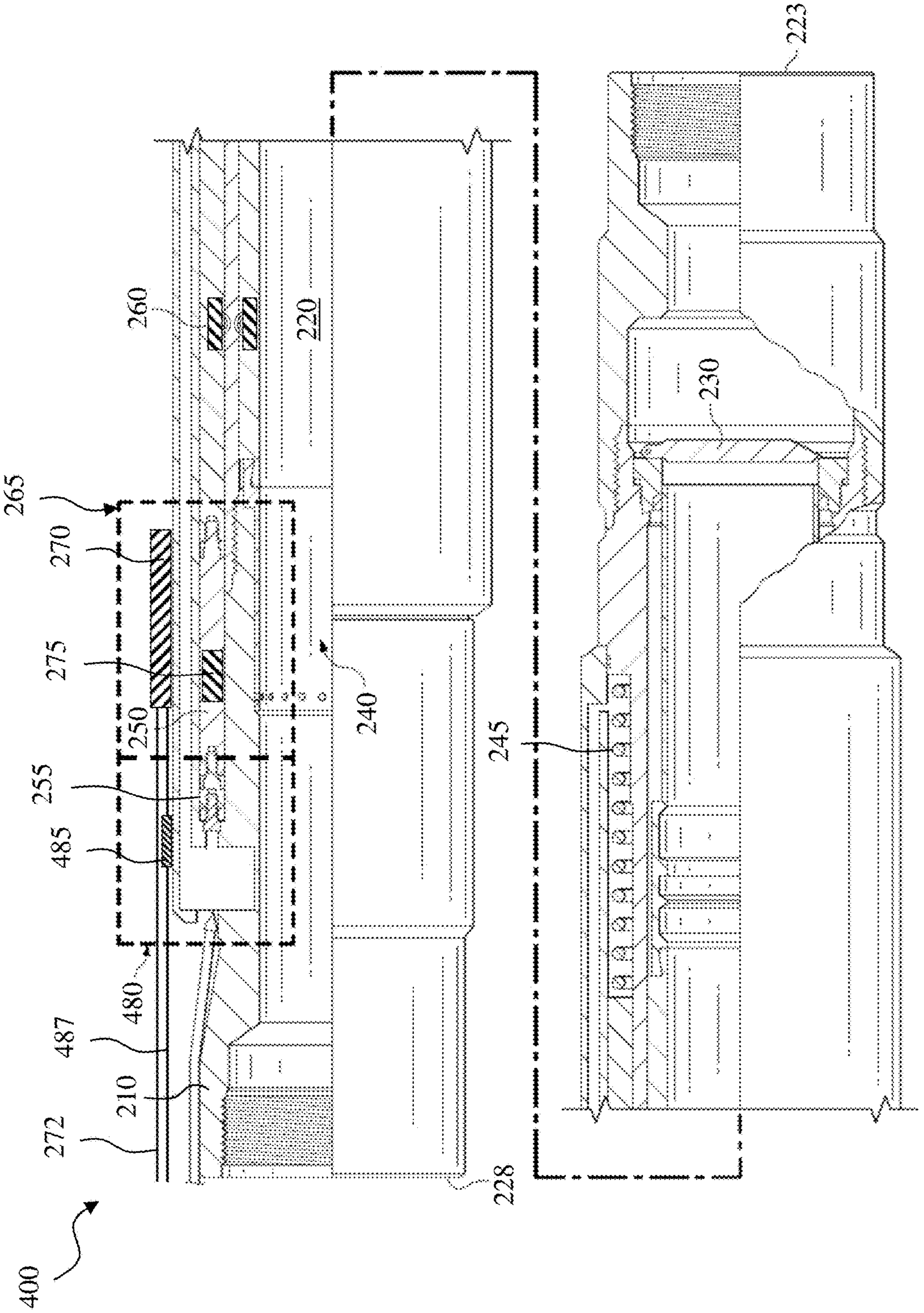
FIGS. 4A and 4B illustrate one embodiment of a safety valve designed, manufactured and/or operated according to one or more alternative embodiments of the present disclosure, closed and open, respectively.
Figure 4B:
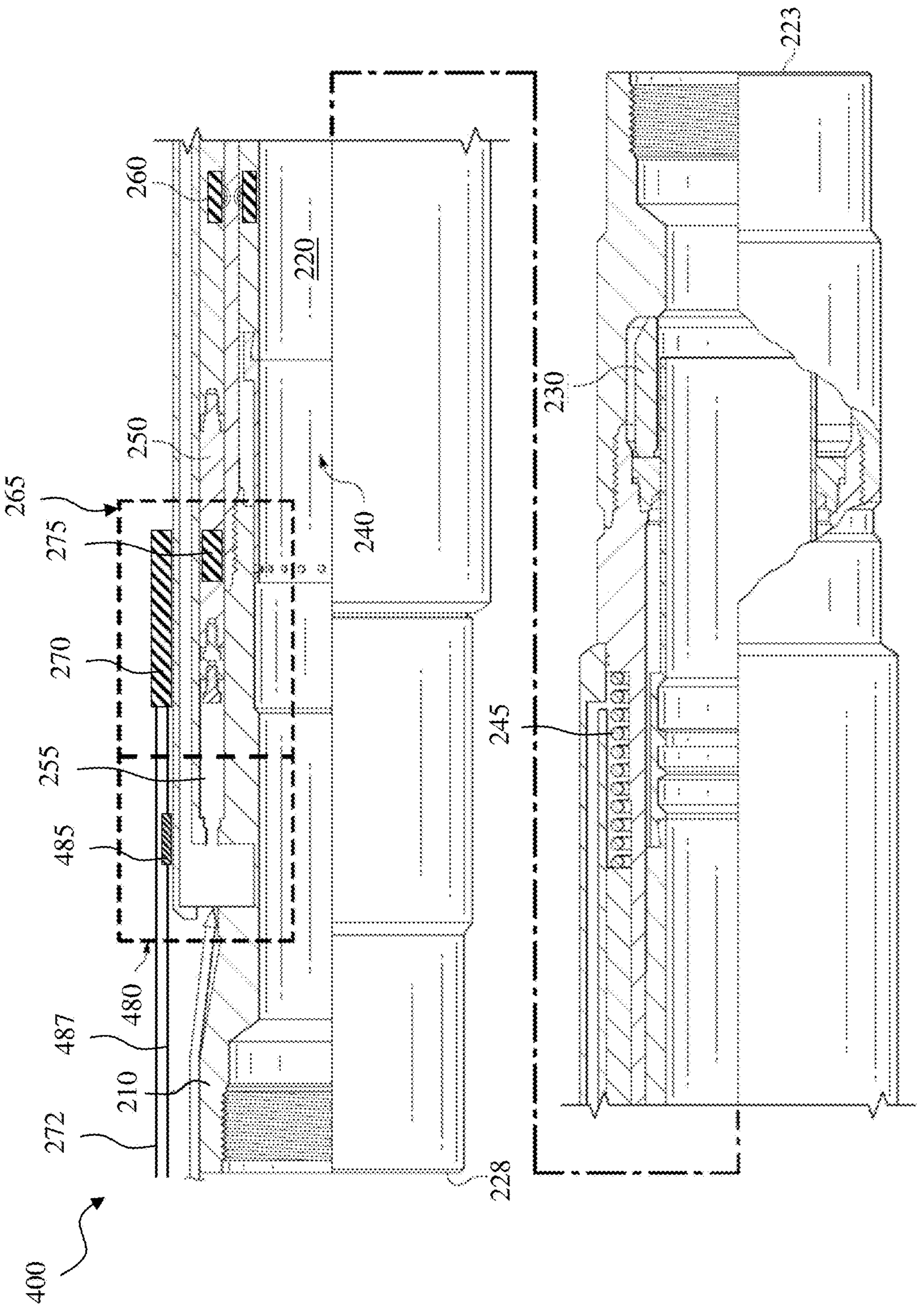

Turning now to FIGS. 4A and 4B, illustrated is one embodiment of a safety valve 400 designed, manufactured and/or operated according to one or more alternative embodiments of the present disclosure, closed and open, respectively. The safety valve 400 of FIGS. 4A and 4B is similar in many respects to the safety valve 200 of FIGS. 2A and 2B. Accordingly, like reference numbers have been used to indicate similar, if not identical, features. The safety valve 400 differs, for the most part, from the safety valve 200, in that the safety valve 400 employs a health/safety component system 480 including an electrical sensor 485. In the illustrated embodiment, the electrical sensor 485 is coupled to the electromagnet 270. The electrical sensor 485, in the illustrated embodiment, is configured to sense for a change in an electrical parameter associated with the electromagnet 270 to determine a health of the safety valve 400. In at least one embodiment, this electrical parameter is the magnetic force that the electromagnet 270 is configured and/or able to generate at a given moment.

The electrical sensor 485 may comprise a variety of different sensors and remain within the scope of the disclosure. Nevertheless, in at least one embodiment, the electrical sensor 485 is a current sensor. In at least this one embodiment, the current sensor is configured to sense for a change in current associated with the electromagnet 270. In an embodiment wherein the electromagnet 270 includes one or more coils, the current sensor may be configured to sense for an increase in current needed to maintain the flow tube 240 in the open position. In yet another embodiment, the electrical sensor 485 is an inductance sensor. In at least this one embodiment, the inductance sensor is configured to sense for a change in inductance associated with the electromagnet 270. In an embodiment wherein the electromagnet 270 includes one or more coils, the inductance sensor may be configured to sense for an increase in inductance needed to maintain the flow tube 240 in the open position. In yet another embodiment, the electrical sensor 485 is a voltage sensor. In at least this one embodiment, the voltage sensor is configured to sense for a change in voltage associated with the electromagnet 270. In an embodiment wherein the electromagnet 270 includes one or more coils, the inductance sensor may be configured to sense for an increase in voltage needed to maintain the flow tube 240 in the open position.

In at least one embodiment, the electrical sensor 485 is coupled to an electrical control line 487 connected to the electromagnet 270. Given this scenario, the electrical sensor 485 may be located at various different locations within the wellbore, or outside of the wellbore. For example, the electrical sensor 485 may be located entirely uphole, and in fact one or more meters away from the wellbore. In yet another embodiment, however, the electrical sensor 485 is physically coupled to the tubular housing 210. For example, in at least one embodiment, the electrical sensor 485 is physically coupled to the tubular housing 210 within 1 meter of the electromagnet 270. In at least one other embodiment, the electrical sensor 485 is physically coupled to the tubular housing 210 within 0.2 meters of the electromagnet 270. Nevertheless, in yet other embodiments the electrical sensor is positioned at least 1 meter, if not at least 10 meters, if not at least 100 meters, if not at least 1000 meters, if not at least 10,000 meters, if not at least 12,000 meters or more.

The embodiments of FIGS. 2A through 4B provide various different health/safety component systems (e.g., 280, 380, 480) including various different sensors (e.g., 285, 385, 485). It should be noted that safety valves according to the disclosure are not limited to a single sensor. In fact, many scenarios exist wherein two or more of the various different sensors (e.g., 285, 385, 485) are employed in a given safety valve. For example, the safety valve could include all three of the temperature sensor 285, the pressure sensor 385, and the electrical sensor 485. In yet another embodiment, the safety valve could include any combination of any two of the temperature sensor 285, the pressure sensor 385, and the electrical sensor 485.

The embodiments of FIGS. 2A through 4B are directed to a tubing retrievable safety valve, and in fact a specific design of a tubing retrievable safety valve. Notwithstanding, the temperature sensor 285, the pressure sensor 385, and the electrical sensor 485 disclosed herein could be equally applicable to different styles of tubing retrievable safety valves, as well as other contingency type safety valves, such a wireline retrievable safety valve. Accordingly, unless otherwise required, the present disclose is not limited to any style or type of safety valve.

Figure 5:
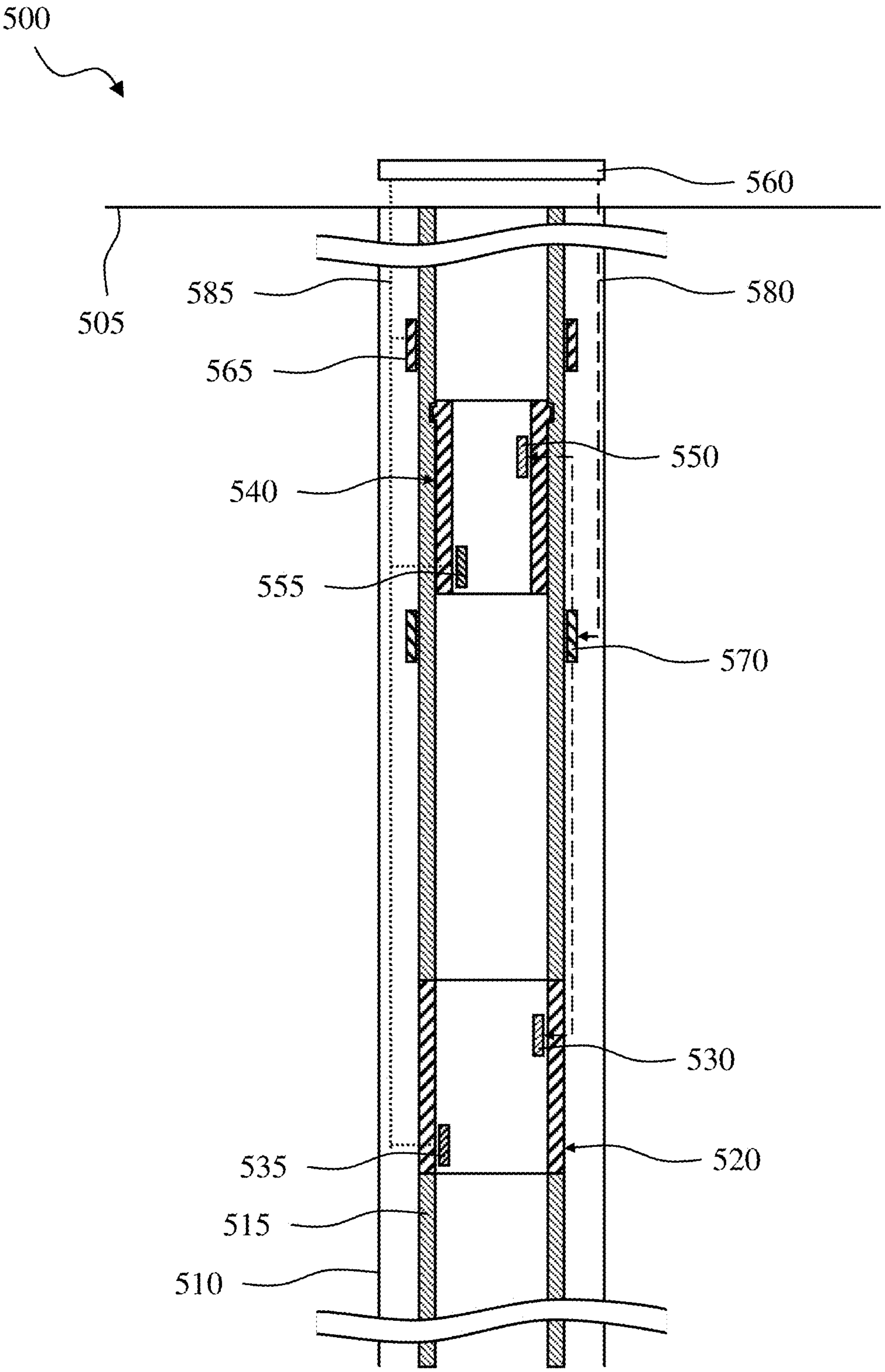
FIG. 5 illustrates one embodiment of a well system designed, manufactured and/or operated according to one or more embodiments of the disclosure.

Turning to FIG. 5, illustrated is one embodiment of a well system 500 designed, manufactured and/or operated according to one or more embodiments of the disclosure. The well system 500 includes a wellbore 510 extending from a terranean surface 505 to one or more subterranean formations, and having production tubing 515 disposed therein. The well system 500 additionally includes a tubing retrievable safety valve 520 coupled (e.g., coupled in line) with the production tubing 515. The tubing retrievable safety valve 520 may include many of the same features as the safety valves 200, 300, 400 disclosed above. In at least one embodiment, the tubing retrievable safety valve 520 includes a tubing retrievable electromagnet 530, for example including one or more electromagnetic coils, as well as a tubing retrievable health/safety component system 535 (e.g., including one or more of the temperature sensors, pressure sensors and/or electrical sensors disclosed above).

The well system 500 additionally contemplates the use of a wireline retrievable safety valve 540, the wireline retrievable safety valve 540 being included within the wellbore 510 when/if the tubing retrievable safety valve 520 is not working as intended/needed. In at least one embodiment, the wireline retrievable safety valve 540 fixedly engages with a landing profile (e.g., landing nipple of the tubing retrievable safety valve 520) to fix the wireline retrievable safety valve 540 in the wellbore 510. The wireline retrievable safety valve 540 may also include many of the same features as the safety valves 200, 300, 400 disclosed above. In at least one embodiment, the wireline retrievable safety valve 540 includes a wireline retrievable electromagnet 550, for example including one or more electromagnetic coils, as well as a wireline retrievable health/safety component system 555 (e.g., including one or more of the temperature sensors, pressure sensors and/or electrical sensors disclosed above).

The well system 500, in the illustrated embodiment, may include a surface controller 560. The well system 500, in the illustrated embodiment, may further include a communications interface 565 (e.g., downhole communications interface), as well as a power switch 570 (e.g., downhole power switch 570). In the illustrated embodiment, a power control line 580 (e.g., tubing encapsulated conductor (TEC)) extends from the surface controller 560 to the power switch 570. The power switch 570, in turn switches power provided by the surface controller 560 between the tubing retrievable electromagnet 530 and the wireline retrievable electromagnet 550, as needed. For example, the power switch 570 would direct the power to the tubing retrievable electromagnet 530 so long as the wireline retrievable safety valve 540 is not installed, but would direct the power to the wireline retrievable electromagnet 550 if the wireline retrievable safety valve 540 has been installed.

In the illustrated embodiment, a separate communications control line 585 (e.g., second TEC) extends from the surface controller 560 to the communications interface 565, as well as to the tubing retrievable health/safety component system 535 and wireline retrievable health/safety component system 555. In the illustrated embodiment, this separate communications control line 585 sends signals and/or data to and from the surface controller 560 and the tubing retrievable health/safety component system 535 and wireline retrievable health/safety component system 555. In at least one embodiment, the separate communications control line 585 takes any data (e.g., raw or processed data) from the temperature sensors and/or pressure sensors of the tubing retrievable health/safety component system 535 and wireline retrievable health/safety component system 555 to the surface terranean 505.

Figure 6:
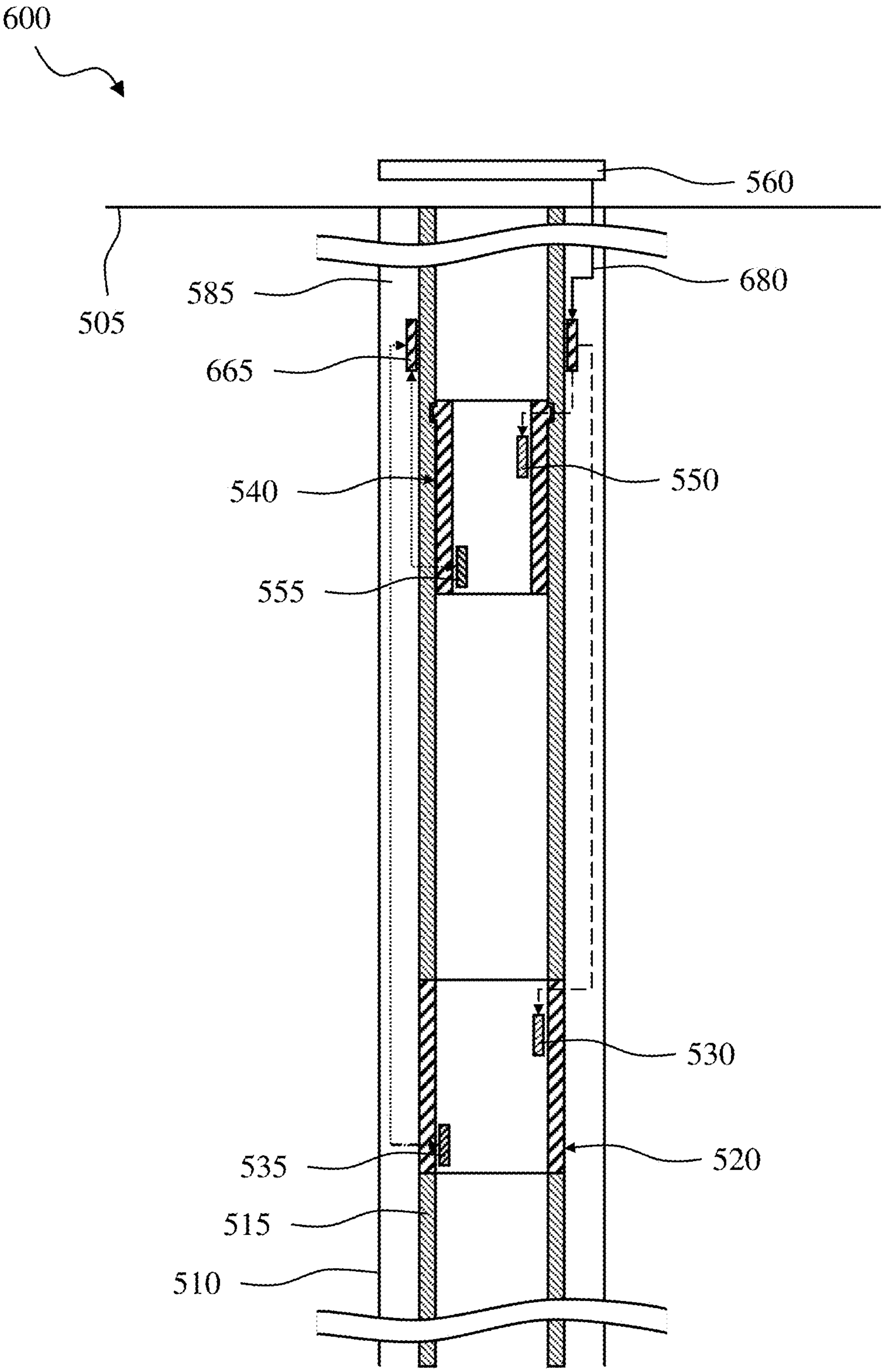
FIG. 6 illustrates one embodiment of a well system designed, manufactured and/or operated according to one or more alternative embodiments of the disclosure.

Turning to FIG. 6, illustrated is one embodiment of a well system 600 designed, manufactured and/or operated according to one or more alternative embodiments of the disclosure. The well system 600 of FIG. 6 is similar in many respects to the well system 500 of FIG. 5. Accordingly, like reference numbers have been used to indicate similar, if not identical, features. The well system 600 differs, for the most part, from the well system 500, in that the well system 600 employs a single power/communications control line 680 (e.g., single TEC) between the surface controller 560 and a power/communications interface 665. The power/communications interface 665 routes the power received from the surface controller 560 to the tubing retrievable electromagnet 530 and the wireline retrievable electromagnet 550, as well as routes the signals and/or data to and from the surface controller 560 and the tubing retrievable health/safety component system 535 and wireline retrievable health/safety component system 555.

Figure 7:
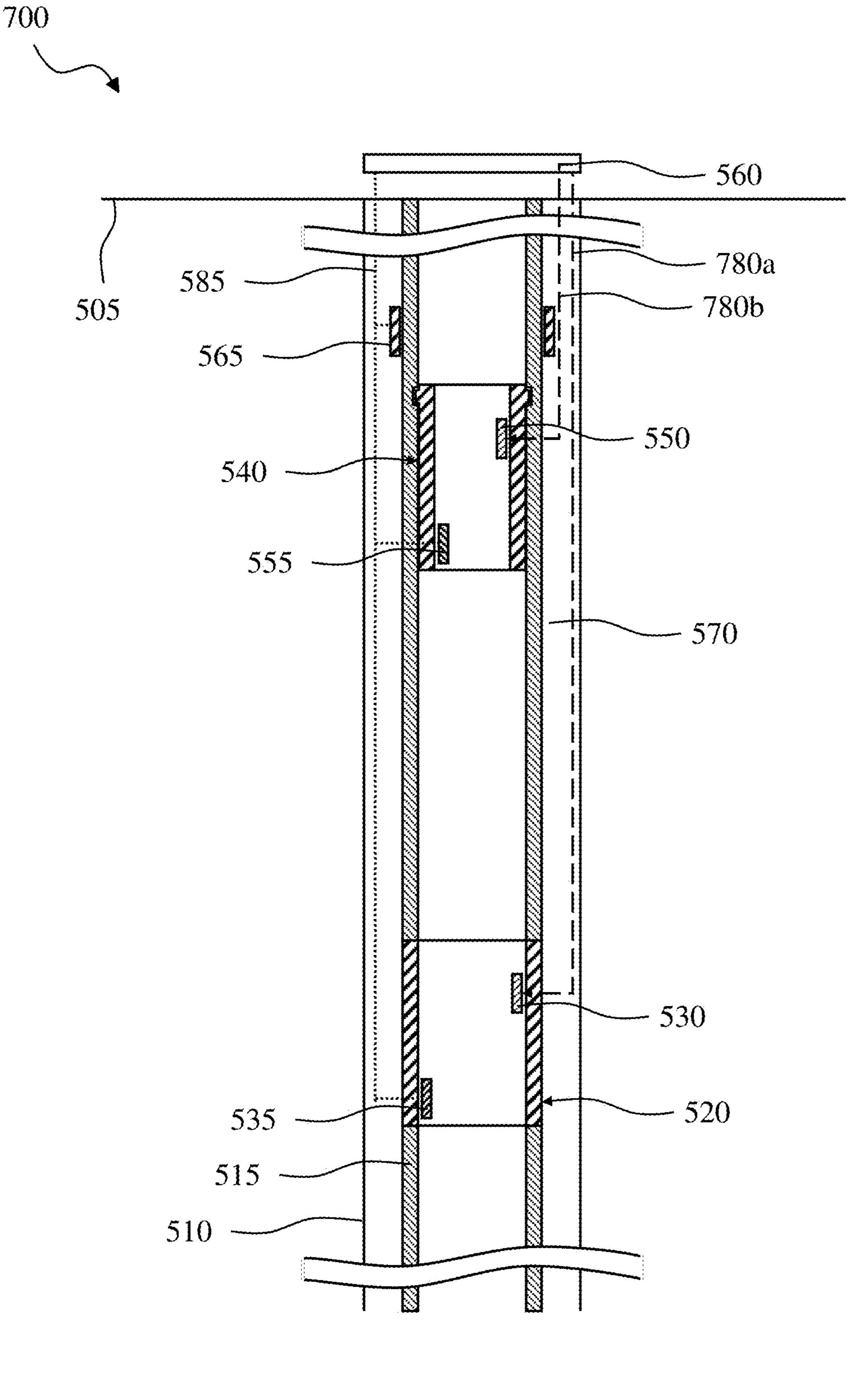
FIG. 7 illustrates one embodiment of a well system designed, manufactured and/or operated according to one or more alternative embodiments of the disclosure.

Turning to FIG. 7, illustrated is one embodiment of a well system 700 designed, manufactured and/or operated according to one or more alternative embodiments of the disclosure. The well system 700 of FIG. 7 is similar in many respects to the well system 500 of FIG. 5. Accordingly, like reference numbers have been used to indicate similar, if not identical, features. The well system 700 differs, for the most part, from the well system 500, in that the well system 700 employs a first power control line **780*a* to provide power from the surface controller 560 to the tubing retrievable electromagnet 530, and a second separate power control line 780*b* to provide power from the surface controller 560 to the wireline retrievable electromagnet 550. Accordingly, the well system 700 does not employ a power switch 570, as employed by the well system 500**.

Aspects disclosed herein include:

A. A safety valve, the safety valve including: 1) a tubular housing; 2) a flow tube positioned within the tubular housing; 3) a valve closure mechanism positioned within the tubular housing, the flow tube configured to move between a closed position and an open position and thereby move the valve closure mechanism between a closed state and an open state; 4) an electromagnet coupled to one of the tubular housing or the flow tube; 5) one or more permanent magnets coupled to an other of the flow tube or the tubular housing; and 6) a temperature sensor thermally coupled to the electromagnet, the temperature sensor configured to sense for a change in a temperature of the electromagnet to determine a health of the safety valve.

B. A well system, the well system including: 1) a wellbore extending through one or more subterranean formations; 2) production tubing disposed in the wellbore; and 3) a safety valve disposed in the production tubing, the safety valve including: a) a tubular housing; b) a flow tube positioned within the tubular housing; c) a valve closure mechanism positioned within the tubular housing, the flow tube configured to move between a closed position and an open position and thereby move the valve closure mechanism between a closed state and an open state; d) an electromagnet coupled to one of the tubular housing or the flow tube; e) one or more permanent magnets coupled to an other of the flow tube or the tubular housing; and f) a temperature sensor thermally coupled to the electromagnet, the temperature sensor configured to sense for a change in a temperature of the electromagnet to determine a health of the safety valve.

C. A method, the method including: 1) positioning production tubing having a safety valve disposed therein in a wellbore, the safety valve including: a) a tubular housing; b) a flow tube positioned within the tubular housing; c) a valve closure mechanism positioned within the tubular housing, the flow tube configured to move between a closed position and an open position and thereby move the valve closure mechanism between a closed state and an open state; d) an electromagnet coupled to one of the tubular housing or the flow tube; e) one or more permanent magnets coupled to an other of the flow tube or the tubular housing; and f) a temperature sensor thermally coupled to the electromagnet; and 2) sensing a change in temperature of the electromagnet using the temperature sensor to determine a health of the safety valve.

D. A safety valve, the safety valve including: 1) a tubular housing; 2) a flow tube positioned within the tubular housing, the flow tube coupled to a hydraulically controlled actuation member located in an actuation member chamber; 3) a valve closure mechanism positioned within the tubular housing, the flow tube configured to move between a closed position and an open position and thereby move the valve closure mechanism between a closed state and an open state; 4) an electromagnet coupled to one of the tubular housing or the flow tube; 5) one or more permanent magnets coupled to an other of the flow tube or the tubular housing; and 6) a pressure sensor coupled to the flow tube, the pressure sensor configured to sense for a change in pressure associated with the flow tube to determine a health of the safety valve.

E. A well system, the well system including: 1) a wellbore extending through one or more subterranean formations; 2) production tubing disposed in the wellbore; and 3) a safety valve disposed in the production tubing, the safety valve including: a) a tubular housing; b) a flow tube positioned within the tubular housing, the flow tube coupled to a hydraulically controlled actuation member located in an actuation member chamber; c) a valve closure mechanism positioned within the tubular housing, the flow tube configured to move between a closed position and an open position and thereby move the valve closure mechanism between a closed state and an open state; d) an electromagnet coupled to one of the tubular housing or the flow tube; e) one or more permanent magnets coupled to an other of the flow tube or the tubular housing; and f) a pressure sensor coupled to the flow tube, the pressure sensor configured to sense for a change in pressure associated with the flow tube to determine a health of the safety valve.

F. A method, the method including: 1) positioning production tubing having a safety valve disposed therein in a wellbore, the safety valve including: a) a tubular housing; b) a flow tube positioned within the tubular housing, the flow tube coupled to a hydraulically controlled actuation member located in an actuation member chamber; c) a valve closure mechanism positioned within the tubular housing, the flow tube configured to move between a closed position and an open position and thereby move the valve closure mechanism between a closed state and an open state; d) an electromagnet coupled to one of the tubular housing or the flow tube; e) one or more permanent magnets coupled to an other of the flow tube or the tubular housing; and f) a pressure sensor coupled to the flow tube; and 2) sensing for a change in pressure associated with the flow tube using the pressure sensor to determine a health of the safety valve.

G. A safety valve, the safety valve including: 1) a tubular housing; 2) a flow tube positioned within the tubular housing; 3) a valve closure mechanism positioned within the tubular housing, the flow tube configured to move between a closed position and an open position and thereby move the valve closure mechanism between a closed state and an open state; 4) an electromagnet coupled to one of the tubular housing or the flow tube; 5) one or more permanent magnets coupled to an other of the flow tube or the tubular housing; and 6) an electrical sensor coupled to the electromagnet, the electrical sensor configured to sense for a change in an electrical parameter associated with the electromagnet to determine a health of the safety valve.

H. A well system, the well system including: 1) a wellbore extending through one or more subterranean formations; 2) production tubing disposed in the wellbore; and 3) a safety valve disposed in the production tubing, the safety valve including: a) a tubular housing; b) a flow tube positioned within the tubular housing; c) a valve closure mechanism positioned within the tubular housing, the flow tube configured to move between a closed position and an open position and thereby move the valve closure mechanism between a closed state and an open state; d) an electromagnet coupled to one of the tubular housing or the flow tube; e) one or more permanent magnets coupled to an other of the flow tube or the tubular housing; and f) an electrical sensor coupled to the electromagnet, the electrical sensor configured to sense for a change in an electrical parameter associated with the electromagnet to determine a health of the safety valve.

I. A method, the method including: 1) positioning production tubing having a safety valve disposed therein in a wellbore, the safety valve including: a) a tubular housing; b) a flow tube positioned within the tubular housing; c) a valve closure mechanism positioned within the tubular housing, the flow tube configured to move between a closed position and an open position and thereby move the valve closure mechanism between a closed state and an open state; d) an electromagnet coupled to one of the tubular housing or the flow tube; 3) one or more permanent magnets coupled to an other of the flow tube or the tubular housing; and f) an electrical sensor coupled to the electromagnet; and 2) sensing for a change in an electrical parameter associated with the electromagnet using the electrical sensor to determine a health of the safety valve.

Aspects A, B, C, D, E, F, G, H, and I may have one or more of the following additional elements in combination: Element 1: wherein the electromagnet includes one or more coils, and further wherein the temperature sensor is thermally coupled to the one or more coils, the temperature sensor configured to sense for a change in a temperature of the one or more coils to determine the health of the safety valve. Element 2: wherein the temperature sensor is configured to sense for an increase in the temperature of the electromagnet to determine the health of the safety valve. Element 3: wherein the temperature sensor is configured to sense for at least a 2 percent increase in the temperature of the electromagnet to determine the health of the safety valve. Element 4: wherein the temperature sensor is configured to sense for at least a 10 percent increase in the temperature of the electromagnet to determine the health of the safety valve. Element 5: wherein the temperature sensor is configured to sense for at least a 25 percent increase in the temperature of the electromagnet to determine the health of the safety valve. Element 6: wherein the electromagnet is physically coupled to the tubular housing and the one or more permanent magnets are physically coupled to the flow tube. Element 7: wherein the temperature sensor is physically coupled to the tubular housing. Element 8: wherein the temperature sensor is physically coupled to the tubular housing within 1 meter of the electromagnet. Element 9: wherein the temperature sensor is physically coupled to the tubular housing within 0.2 meters of the electromagnet. Element 10: wherein the hydraulically controlled actuation member is a piston and the actuation member chamber is a piston chamber. Element 11: wherein the pressure sensor is coupled to the piston chamber. Element 12: wherein the pressure sensor is coupled to the piston chamber on a side of the piston distal the valve closure mechanism. Element 13: wherein the pressure sensor is configured to measure for changes in back pressure on the piston over time, and thus be used to indicate that there is debris settlement arresting movement of the flow tube. Element 14: wherein the pressure sensor is configured to measure for at least a 2 percent increase in pressure on the piston over time. Element 15: wherein the pressure sensor is configured to measure for at least a 10 percent increase in pressure on the piston over time. Element 16: wherein the pressure sensor is configured to measure for at least a 25 percent increase in pressure on the piston over time. Element 17: wherein the electromagnet is physically coupled to the tubular housing and the one or more permanent magnets are physically coupled to the flow tube. Element 18: wherein the electromagnet is physically coupled to the flow tube and the one or more permanent magnets are physically coupled to the tubular housing. Element 19: wherein the hydraulically controlled actuation member is a piston and the actuation member chamber is a piston chamber, and further wherein sensing for a change in pressure associated with the flow tube includes sensing for a change in pressure in the piston chamber. Element 20: wherein the sensing for the change in pressure in the piston chamber includes sensing for changes in back pressure on the piston over time. Element 21: wherein the electrical sensor is a current sensor, and further wherein the current sensor is configured to sense for a change in current associated with the electromagnet. Element 22: wherein the electromagnet includes one or more coils, and further wherein the current sensor is configured to sense for an increase in current needed to maintain the flow tube in the open position. Element 23: wherein the electrical sensor is an inductance sensor, and further wherein the inductance sensor is configured to sense for a change in inductance associated with the electromagnet. Element 24: wherein the electromagnet includes one or more coils, and further wherein the inductance sensor is configured to sense for an increase in inductance needed to maintain the flow tube in the open position. Element 25: wherein the electrical sensor is coupled to an electrical control line connected to the electromagnet. Element 26: wherein the electromagnet is physically coupled to the tubular housing and the one or more permanent magnets are physically coupled to the flow tube. Element 27: wherein the electrical sensor is physically coupled to the tubular housing. Element 28: wherein the electrical sensor is physically coupled to the tubular housing within 1 meter of the electromagnet. Element 29: wherein the electrical sensor is physically coupled to the tubular housing within 0.2 meters of the electromagnet. Element 30: wherein the electrical sensor is a current sensor, and further wherein sensing for the change in the electrical parameter includes sensing for a change in current associated with the electromagnet. Element 31: wherein sensing for the change in current includes sensing for an increase in current needed to maintain the flow tube in the open position. Element 32:

wherein the electrical sensor is an inductance sensor, and further wherein sensing for the change in the electrical parameter includes sensing for a change in inductance associated with the electromagnet. Element 33: wherein sensing for the change in inductance includes sensing for an increase in inductance needed to maintain the flow tube in the open position.

Those skilled in the art to which this application relates will appreciate that other and further additions, deletions, substitutions and modifications may be made to the described embodiments.

What is claimed is:

1. A safety valve, comprising:
- a tubular housing;
- a flow tube positioned within the tubular housing;
- a valve closure mechanism positioned within the tubular housing, the flow tube configured to move between a closed position and an open position and thereby move the valve closure mechanism between a closed state and an open state;
- an electromagnet coupled to one of the tubular housing or the flow tube;
- one or more permanent magnets coupled to an other of the flow tube or the tubular housing; and
- an electrical sensor coupled to the electromagnet, the electrical sensor configured to sense for a change in an electrical parameter associated with the electromagnet to determine a health of the safety valve.

2. The safety valve as recited in claim 1, wherein the electrical sensor is a current sensor, and further wherein the current sensor is configured to sense for a change in current associated with the electromagnet.

3. The safety valve as recited in claim 2, wherein the electromagnet includes one or more coils, and further wherein the current sensor is configured to sense for an increase in current needed to maintain the flow tube in the open position.

4. The safety valve as recited in claim 1, wherein the electrical sensor is an inductance sensor, and further wherein the inductance sensor is configured to sense for a change in inductance associated with the electromagnet.

5. The safety valve as recited in claim 4, wherein the electromagnet includes one or more coils, and further wherein the inductance sensor is configured to sense for an increase in inductance needed to maintain the flow tube in the open position.

6. The safety valve as recited in claim 1, wherein the electrical sensor is coupled to an electrical control line connected to the electromagnet.

7. The safety valve as recited in claim 1, wherein the electromagnet is physically coupled to the tubular housing and the one or more permanent magnets are physically coupled to the flow tube.

8. The safety valve as recited in claim 7, wherein the electrical sensor is physically coupled to the tubular housing.

9. The safety valve as recited in claim 8, wherein the electrical sensor is physically coupled to the tubular housing within 1 meter of the electromagnet.

10. The safety valve as recited in claim 8, wherein the electrical sensor is physically coupled to the tubular housing within 0.2 meters of the electromagnet.

11. A well system, comprising:
- a wellbore extending through one or more subterranean formations;
- production tubing disposed in the wellbore; and
- a safety valve disposed in the production tubing, the safety valve including:
  - a tubular housing;
  - a flow tube positioned within the tubular housing;
  - a valve closure mechanism positioned within the tubular housing, the flow tube configured to move between a closed position and an open position and thereby move the valve closure mechanism between a closed state and an open state;
  - an electromagnet coupled to one of the tubular housing or the flow tube;
  - one or more permanent magnets coupled to an other of the flow tube or the tubular housing; and
  - an electrical sensor coupled to the electromagnet, the electrical sensor configured to sense for a change in an electrical parameter associated with the electromagnet to determine a health of the safety valve.

12. The well system as recited in claim 11, wherein the electrical sensor is a current sensor, and further wherein the current sensor is configured to sense for a change in current associated with the electromagnet.

13. The well system as recited in claim 12, wherein the electromagnet includes one or more coils, and further wherein the current sensor is configured to sense for an increase in current needed to maintain the flow tube in the open position.

14. The well system as recited in claim 11, wherein the electrical sensor is an inductance sensor, and further wherein the inductance sensor is configured to sense for a change in inductance associated with the electromagnet.

15. The well system as recited in claim 14, wherein the electromagnet includes one or more coils, and further wherein the inductance sensor is configured to sense for an increase in inductance needed to maintain the flow tube in the open position.

16. The well system as recited in claim 11, wherein the electrical sensor is coupled to an electrical control line connected to the electromagnet.

17. The well system as recited in claim 11, wherein the electromagnet is physically coupled to the tubular housing and the one or more permanent magnets are physically coupled to the flow tube.

18. The well system as recited in claim 17, wherein the electrical sensor is physically coupled to the tubular housing.

19. The well system as recited in claim 18, wherein the electrical sensor is physically coupled to the tubular housing within 1 meter of the electromagnet.

20. The well system as recited in claim 18, wherein the electrical sensor is physically coupled to the tubular housing within 0.2 meters of the electromagnet.

21. A method, comprising:
- positioning production tubing having a safety valve disposed therein in a wellbore, the safety valve including:
  - a tubular housing;
  - a flow tube positioned within the tubular housing;
  - a valve closure mechanism positioned within the tubular housing, the flow tube configured to move between a closed position and an open position and thereby move the valve closure mechanism between a closed state and an open state;
  - an electromagnet coupled to one of the tubular housing or the flow tube;
  - one or more permanent magnets coupled to an other of the flow tube or the tubular housing; and
  - an electrical sensor coupled to the electromagnet; and sensing for a change in an electrical parameter associated with the electromagnet using the electrical sensor to determine a health of the safety valve.

22. The method as recited in claim 21, wherein the electrical sensor is a current sensor, and further wherein sensing for the change in the electrical parameter includes sensing for a change in current associated with the electromagnet.

23. The method as recited in claim 22, wherein sensing for the change in current includes sensing for an increase in current needed to maintain the flow tube in the open position.

24. The method as recited in claim 21, wherein the electrical sensor is an inductance sensor, and further wherein sensing for the change in the electrical parameter includes sensing for a change in inductance associated with the electromagnet.

25. The method as recited in claim 24, wherein sensing for the change in inductance includes sensing for an increase in inductance needed to maintain the flow tube in the open position.

* * * * *